(PRIOR ART) Fig. 1
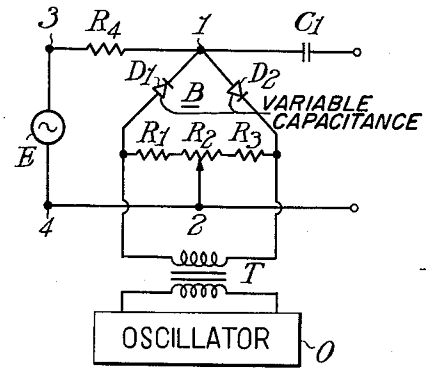
Fig. 3
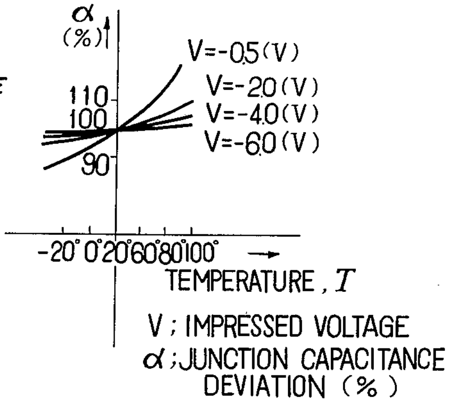
Fig. 2
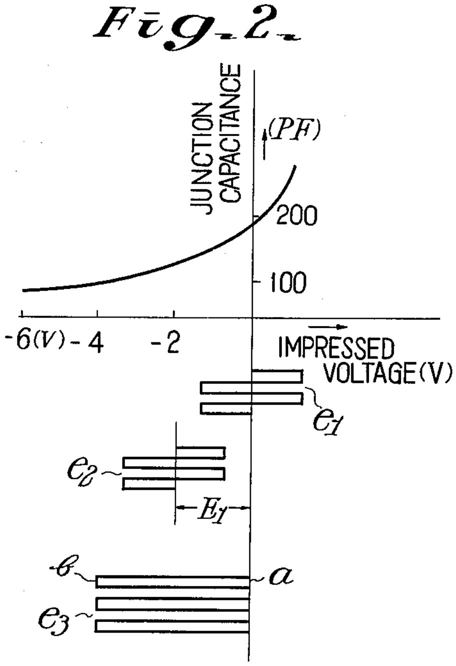
Fig. 4 (PRIOR ART)
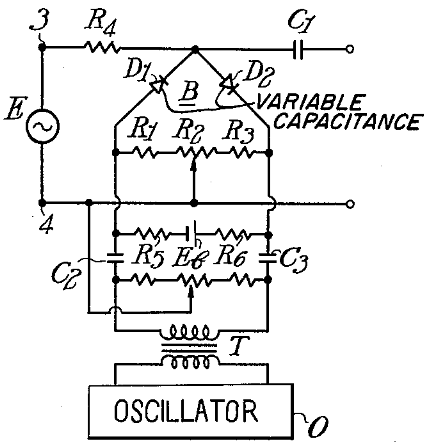

VARIABLE-CAPACITANCE DIODE MODULATOR

Filed Feb. 19, 1963

United States Patent Office 3,221,272 Patented Nov. 30, 1965

3,221,272
VARIABLE-CAPACITANCE DIODE MODULATOR
Nobuhiko Aoki, Hachioji-shi, and Zenmon Abe, Tokyo-to, Japan, assignors to Kabushiki Kaisha Hitachi Seisakusho, Tokyo-to, Japan, a joint-stock company of Japan
Filed Feb. 19, 1963, Ser. No. 259,585
Claims priority, application Japan, Feb. 22, 1962, 37/6,040
9 Claims. (Cl. 332—47)

This invention relates to modulators of the type wherein diodes are used, and more particularly it relates to a new variable-capacitance diode modulator having highly desirable characteristics.

It is well known that a modulator can be constructed by utilizing the fact that the junction capacitance of a semiconductor diode varies in accordance with the magnitude of the voltage impressed across the diode terminals. Since such a variable-capacitance diode modulator is capable of accommodating a much higher input impedance than other modulators in which semiconductors are used, it has been regarded as being promising for modulation of direct-current amplifiers of high input impedances in electronic process controllers and like systems.

The present invention, in its broader aspects, contemplates eliminating certain disadvantages of conventional modulators of the instant type, as will be described in detail hereinafter.

The nature, principle, and details, as well as the objects and advantages, of the invention will be best understood by reference to the following desecription, taken in conjunction with the accompanying drawings in which like parts are designated by like reference numerals and letters, and in which:

FIG. 1 is an electrical circuit diagram presented for a description of the principle of a variable-capacitance diode modulator;

FIG. 2 is a graphical representation indicating the characteristics of the circuit shown in FIG. 1, FIG. 4, FIG. 5, and FIG. 6;

FIG. 3 is a graphical representation indicating variations of characteristics with temperature;

FIG. 4 is an electrical circuit diagram indicating a typical modulator circuit of conventional type.

Figure 5:
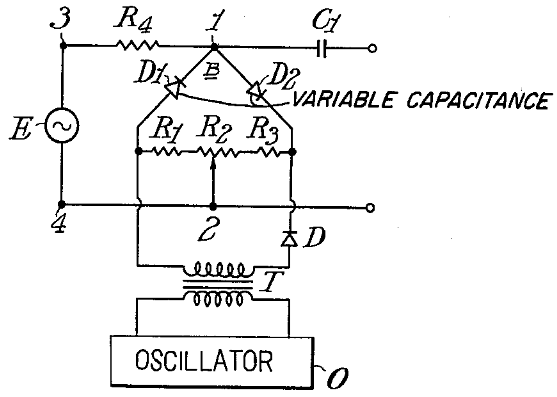
FIGS. 5 and 6 are electrical circuit diagrams indicating circuits of embodiments of the present invention.

Referring to FIG. 1, the afore-mentioned variable-capacitance diode modulator, in general, has a bridge B composed of variable-capacitance diodes $D_1$ and $D_2$ and resistances $R_1$, $R_2$, and $R_3$. This bridge B is excited by an oscillator O through an exciting transformer T and is supplied with input signals from an input signal source E through a resistance $R_4$.

With the input voltage E at zero value, the bridge B is adjusted to be in a balanced state. That is, the variable resistor $R_2$ is so adjusted that alternating-current voltage excited by the oscillator O does not appear between the output terminals 1 and 2 of the bridge B at this time. Next, when a low-frequency signal voltage of very small magnitude is generated in the input E, if, at this time, the impedance of the variable-capacitance diodes $D_1$ and $D_2$ with respect to the said signal voltage is sufficiently high relative to the resistance $R_4$ and to resistances $R_1$, $R_2$, and $R_3$, approximately all of the signal voltage of the input E will be impressed on the diodes $D_1$ and $D_2$. Accordingly, if the signal voltage of the input E is positive on the side of the input terminal 3, an inverse voltage will be applied on the diode $D_1$, and the junction capacitance thereof will be reduced. On the other hand, a forward voltage will be applied on the diode $D_2$, and the junction capacitance thereof will be increased. That is, when a very small input voltage is applied between the input terminals 3 and 4, the balanced state of the bridge B is disturbed in accordance with the magnitude of the said voltage, and the exciting voltage from the oscillator O appears between the output terminals 1 and 2 in accordance with the degree of unbalance of the bridge B. The unbalanced output so produced is passed through a D.C. blocking capacitor $C_1$ and, if necessary, is subjected to impedance matching through the further use of tuning coils, transformers, and other components, and the resulting output is transmitted to an A.C. amplifier. The variable-capacitance diode modulator, the compositional arrangement of which has been described above from the viewpoint of principle, has the following disadvantages.

Each of the variable-capacitance diodes $D_1$ and $D_2$ in this circuit is biased to zero voltage, and the exciting voltage from the oscillator O is applied in the forward and inverse directions of the diodes $D_1$ and $D_2$ according to its polarity. Accordingly, when an exciting voltage is applied in the inverse direction of the diodes $D_1$ and $D_2$, the D.C. impedance at the time is amply high, but when the excitation is in the forward direction, the D.C. impedance is low. Then, if in order to obtain a high modulation efficiency, the amplitude of the exciting voltage is increased to a certain degree, the effective impedance as considered from the input side becomes low, and the high input impedance, which is one of the unique features of the variable capacitance type, is lost.

Furthermore, the use of the diodes $D_1$ and $D_2$ in the vicinity of zero bias gives rise to the disadvantage of poor stability with respect to temperature. This disadvantage will now be considered in detail in conjunction with FIGS. 2 and 3. FIG. 2 indicates the relationship betwen the aforesaid junction capacitance of the variable-capacitance diodes and the impressed voltage. The reference character $e_1$ denotes the exciting voltage. FIG. 3 indicates the deviation rate $\alpha$ of the junction capacitance with variation in the surrounding temperature. It will be apparent from FIG. 3 that the deviation, due to temperature variation, of the junction capacitance increases with increase in impressed voltage on the forward side. Accordingly, in the case wherein the exciting voltage is applied in both forward and inverse directions with the zero point as the center, as in the case of $e_1$ in the above-described manner, the input impedance is lowered, and the stability with respect to temperature is poor.

In one endeavor by the prior art to eliminate such disadvantages of the zero-bias excitation method, there has been proposed a bias excitation system wherein, as shown in FIG. 4, a bias circuit comprising bias resistances $R_5$, $R_6$, $R_1$, $R_2$, and $R_3$ and a D.C. power source $E_b$ for bias is added. By this arrangement, after a D.C. bias voltage $E_1$ in the inverse direction has been impressed on the variable-capacitance diodes $D_1$ and $D_2$, the output of the exciting transformer is passed through capacitors $C_2$ and $C_3$ and impressed on the bridge B, and, as indicated at $e_2$ in FIG. 2, the variable-capacitance diodes $D_1$ and $D_2$ are caused to operate always within a range of inverse voltage. By this arrangement, since no forward voltage is applied on the diodes $D_1$ and $D_2$, it is possible to make the input impedance amply high. On the other hand, however, there is the necessity of adding a biasing network for the purpose of imparting an inverse bias voltage. Moreover, since fluctuations of the power source $E_b$ of the above circuit cause drift, a power source of extremely high stability is necessary. Furthermore, when a storage battery is used for the power source $E_b$, it gives rise to many problems, such as the problem of battery life.

In view of the foregoing considerations, it is a prime object of the present invention to provide a new and improved, variable-capacitance diode modulator wherein the above-described disadvantages and defects of conventional modulators are eliminated or substantially remedied.

It is another object of the invention to provide a modulator as defined in the preceding paragraph which has a simple circuit arrangement and simple operation.

The foregoing as well as other objects have been achieved by the present invention, which is described below with respect to preferred embodiments thereof.

Referring to FIG. 5, the circuit arrangement of the embodiment according to this invention shown is provided with a diode D in which ordinary unilateral characteristic is utilized, and which is inserted in the exciting voltage supply circuit with inverse polarity with respect to the variable-capacitance diodes $D_1$ and $D_2$ of the bridge. In the case when the diode D is inserted in this manner, the output voltage of the exciting transformer T passes through the said diode D only during the interval when the said output voltage is applied to the inverse direction on the diodes $D_1$ and $D_2$, and, during the interval when the said transformer output voltage is in the forward direction with respect to the diodes $D_1$ and $D_2$, the said voltage is blocked by the diode D. That is, the existence of the diode D causes only the inverse voltage of the exciting output of the exciting transformer T to be impressed on the bridge B.

Accordingly, in the above circuit, there is no necessity of especially providing a bias circuit as in the case of a conventional bias system as shown in FIG. 4, and merely by inserting a single diode element, it is possible to prevent the lowering of the input impedance which has been problematical in the zero-bias type modulator shown in FIG. 1, and the desired high input impedance can be attained in a simple manner.

The case wherein, in the above-described modulator of this invention, a rectangular waveform is used for the waveform of the exciting voltage will now be considered. If the time constant of the bridge circuit B, that is, the time constant of the D.C. network consisting of the resistance $R_1$, $R_2$, and $R_3$ and the junction capacitance of the diodes $D_1$ and $D_2$, is sufficiently small in comparison with the period of the exciting voltage, the exciting voltage then applied on the bridge B will be rectified square wave as indicated by $e_3$ in FIG. 2. This exciting voltage $e_3$, differing from that in D.C. bias type modulator of FIG. 4, has a zero-side level *a* which is constantly fixed at zero voltage even when the amplitude of the exciting voltage fluctuates, and only the maximum amplitude level *b* fluctuates.

This operation, from the characteristics of the variable-capacitance diodes, gives rise to the following advantages. As will be apparent from FIGS. 2 and 3, the deviation of the junction capacitance of the variable-capacitance diodes with respect to the impressed voltage is the highest in the vicinity of zero voltage and decreases as the inverse voltage increases. Furthermore, the stability with respect to temperature becomes poorer as the impressed voltage increases on the forward voltage side and becomes better as the inverse voltage increases. Accordingly, on the zero-voltage side where, as described above, the junction capacity deviation is large, and the stability with respect to temperature is poor, the zero side level of the exciting voltage is constantly and fully fixed, irrespective of amplitude fluctuation, whereby it is possible to obtain an operation which is extremely stable with respect to fluctuations of the exciting voltage and temperature variations.

In the case when the above-mentioned time constant of the bridge B is so set that it cannot be considered to be sufficiently small relative to the period of the exciting voltage, a steady charge is accumulated in the junction capacitance of the diodes $D_1$ and $D_2$, and even when the rectified exciting voltage becomes zero, some inverse current and voltage still remain. For this reason, it becomes impossible to utilize fully the portion of large deviation of the junction capacitance in the vicinity of zero voltage, the modulation efficiency is lowered, and the advantage gained in the case when one side of a rectified exciting voltage is constantly fixed at the zero point is reduced. However, the operation, as that of a modulator, is not seriously affected in an adverse manner. On the contrary, since there is an effect in this case which increases the input impedance, this arrangement is suitable for use in the case when a modulator with especially high input impedance is required. While, in the example circuit shown in FIG. 5, only a single rectifying diode is used, if another rectifying diode is additionally inserted also in the side of opposite polarity of the output winding of the exciting transformer, the balance of the modulator bridge at the time of zero input will be improved.

Figure 6:
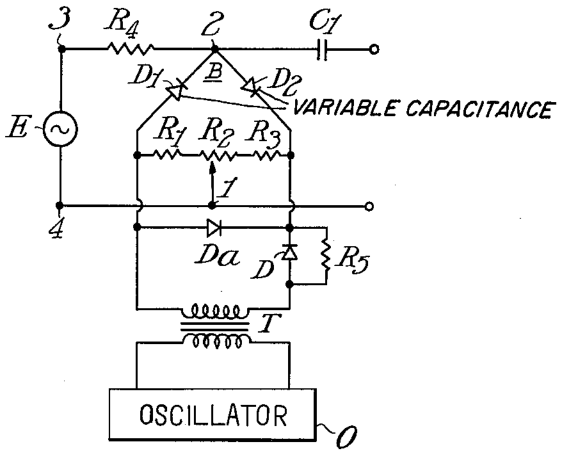

While the above-described rectified exciting method according to this invention is carried into practice by inserting a diode D in series in the exciting circuit of the bridge B, the objects of the invention can be attained also by means of such a circuit as is indicated in FIG. 6. The circuit of the embodiment shown in FIG. 6 is formed by further connecting a clamping diode D*a* in parallel to the terminals for impressing exciting voltage on the bridge B of the circuit shown in FIG. 5 and connecting a resistance $R_5$ in parallel with the diode D.

In the operation of this circuit, when an exciting voltage which is positive on the side where the diode D is connected is generated in the output of the exciting transformer T, an inverse exciting voltage is imparted through the diode D to the diodes $D_1$ and $D_2$. When an exciting voltage of a polarity opposite that mentioned above is generated, the diode D becomes non-conductive, and the clamping diode D*a* is caused to be conductive by a voltage imparted through the resistance $R_5$, whereby the bridge B is excited by the forward voltage of this diode D*a*. Although this forward voltage of the diode D*a* is applied in the forward direction with respect to the variable-capacitance diodes $D_1$ and $D_2$, these diodes $D_1$ and $D_2$ are not caused thereby to build up fully, and since the said forward voltage is of extremely low value within a range which does not cause the diodes to become conductive, it does not give rise to a great lowering of the input impedance. In the case of the above-described circuit, the input impedance is lowered to a certain degree, but a wide range of deviation of the junction capacitance in the vicinity of zero bias of the diodes $D_1$ and $D_2$ can be effectively used, and the voltage modulation efficiency can be increased.

Furthermore, when an element, such as a Zener diode, exhibiting a breakdown phenomenon with respect to inverse voltage is used for the clamping diode D*a*, the exciting voltage imparted in the forward direction with respect to the variable-capacitance diodes $D_1$ and $D_2$ is clamped at approximately zero voltage, and the exciting voltage imparted in the inverse direction with respect to the diodes $D_1$ and $D_2$ is clamped at a certain voltage which is determined by the Zener voltage of this Zener diode, whereby an effect which stabilizes the exciting voltage is attained. In addition, if the resistance values of the resistance $R_1$, $R_2$, and $R_5$ of the circuit shown in FIG. 6 are suitably selected, the circuit may be used to produce a modified rectified excitation even when the diode D or D*a* is removed. It has been found that in this case, when a Zener diode is used for the diode D*a*, the stabilization of the exciting voltage is improved by the removal of the diode D.

The modulator of the above description may be modified by the use of a bridge of balanced type, in which case the present invention can be applied directly thereto with equal effectiveness.

It is to be observed that the present invention achieves its objects hereinbefore stated through an extremely simple circuit.

Although this invention has been described with respect to particular embodiments thereof, it is not to be so limited as changes and modifications may be made therein which are within the full intended scope of the invention, as defined by the appended claims.

What we claim is:

1. A variable-capacitance diode modulator of the type in which signals to be modulated are impressed on the detecting terminals of a bridge circuit having a variable-capacitance diode in at least one arm thereof, and modulation is accomplished by exciting the said bridge circuit with alternating-current voltage, wherein there is further provided at least one unilateral element in the circuit for impressing exciting voltage on the said bridge circuit, the said unilateral element imparting a high exciting voltage to the inverse side of the said variable-capacitance diode and imparting a voltage which is less than the voltage at which the said diode becomes conductive to the forward side of the said diode.

2. A variable-capacitance diode modulator according to claim 1, wherein a diode for rectification is inserted in series connection to a terminal for impressing exciting voltage on the said bridge circuit, blocking any forward voltage which would otherwise be imparted to the said variable-capacitance diode within the said bridge circuit, and alternating-current exciting voltage is impressed through the said diode for rectification.

3. A variable-capacitance diode modulator according to claim 1, wherein a diode for rectification is connected in parallel across the terminals for impressing exciting voltage on the said bridge circuit so as to prevent forward voltage from being imparted to the variable-capacitance diode within the said bridge circuit.

4. A variable-capacitance diode modulator according to claim 1, wherein there is provided a clamping element having conductive characteristic with respect to forward voltage and Zener characteristic with respect to inverse voltage, the said clamping element being inserted in the circuit for impressing exciting voltage on the said bridge circuit imparting the exciting voltage to the inverse side of the said variable-capacitance diode to be clamped at a constant magnitude and the exciting voltage imparted to the forward side of the said diode to be clamped at approximately zero potential.

5. A modulator according to claim 1, which is arranged so that, by setting the time constant of the said bridge circuit to be greater than the exciting voltage period, an inverse direct-current voltage remains in residual state, and the said exciting voltage is superimposed on the said residual inverse direct-current voltage.

6. A variable-capacitance diode modulator comprising, in combination: a four-arm bridge circuit having a variable capacitance diode at least at one arm thereof; means for connecting, through an input resistor, first pairs of opposed junctions of the said bridge circuit to a terminal to be imparted with input signals; means for connecting second pairs of opposed junctions of the said bridge circuit to a transformer to be imparted with carrier signals; and semiconductor diodes inserted in the transmission path for exciting carrier signals provided between the said transformer and the bridge circuit; thereby setting the connecting direction of the said semiconductor diodes in the non-conductive direction when a voltage having polarity to make the variable capacitance diode conductive is generated in the said transformer.

7. A variable capacitance diode modulator comprising, in combination: a four-arm bridge circuit having a variable capacitance diode at least at one arm thereof; means for connecting, through an input resistor, first pairs of opposed junctions of the said bridge circuit to a terminal to be imparted with input signals; means for connecting second pairs of opposed junctions of said bridge circuit to the exciting transformer to be imparted with carrier signals; a rectifier diode connected in parallel with said bridge circuit in the transmission path of the carrier signal between said bridge circuit and the exciting transformer; and a resistor inserted in the transmission path provided between said diode and the exciting transformer; thereby setting the polarity of the said rectifier diode to be in the non-conductive direction when a voltage having polarity to make the variable capacitance diode conductive is generated in the said exciting transformer.

8. The variable capacitance diode modulator according to claim 7, wherein a second rectifier diode is inserted in parallel with the resistor inserted in the transmission path of the carrier signal, whereby the connecting direction of said second rectifier diode is established in the non-conductive direction when a voltage which makes the variable capacitance diode conductive is generated in the exciting transformer.

9. A variable capacitance diode modulator according to claim 8 wherein a Zener diode is inserted in place of a rectifier diode in parallel with the bridge circuit.

References Cited by the Examiner

UNITED STATES PATENTS

| | | | |
|---|---|---|---|
| 2,799,829 | 7/1957 | Gordon et al. | 332—47 |
| 3,023,378 | 2/1962 | Fuller. | |
| 3,099,798 | 7/1963 | Miller. | |

HERMAN KARL SAALBACH, *Primary Examiner.*

ALFRED L. BRODY, *Examiner.*